United States Patent [19]
Iwata et al.

[11] Patent Number: 5,528,527
[45] Date of Patent: Jun. 18, 1996

[54] SAMPLING FREQUENCY CONVERTER

[75] Inventors: Toshio Iwata, Sagamihara; Toshiaki Nishida, Machida; Tsuyoshi Tsumuraya, Kawasaki, all of Japan

[73] Assignee: Kabushiki Kaisha Kenwood, Tokyo, Japan

[21] Appl. No.: 391,468

[22] Filed: Feb. 21, 1995

Related U.S. Application Data

[63] Continuation of Ser. No. 24,202, Feb. 23, 1993, abandoned.

[30] Foreign Application Priority Data

Feb. 24, 1992 [JP] Japan ................................ 4-072105

[51] Int. Cl.⁶ .............................. G06F 15/31; H03M 1/00
[52] U.S. Cl. ................................ 364/724.13; 364/726.01; 341/123
[58] Field of Search ........................ 364/724.1, 724.13, 364/724.08; 341/123

[56] References Cited

U.S. PATENT DOCUMENTS 4,817,025 3/1989 Asai et al. ...................... 364/724.01
4,990,911 2/1991 Fujita et al. ........................ 341/123

*Primary Examiner*—Roy N. Envall, Jr.
*Assistant Examiner*—Emmanuel L. Moise
*Attorney, Agent, or Firm*—Sixbey, Friedman, Leedom & Ferguson; Gerald J. Ferguson, Jr.; Eric J. Robinson

[57] ABSTRACT

A sampling frequency converter capable of performing an operation of multiplications and additions at a lower speed and realizing with a small amount of hardware. The sampling frequency converter for converting input data sampled at a sampling frequency M into data sampled at sampling frequency N, includes: a non-cyclic digital filer including a memory for sequentially putting and storing E data elements in response to clocks of the sampling frequency M, and reading the stored E data elements in parallel and in response to each clock of the sampling frequency M, a plurality of coefficient multipliers for selecting E coefficients in response to each clock of the sampling frequency N, the E coefficients being extracted from (J*E/M) coefficients every (J/M)-th where J is the least common denominator of M and N, and multiplying each data element read from the memory by a corresponding one of the selected coefficients, and an adder for adding the multiplication results by the coefficient multipliers together; and a sampler for sampling an output of the non-cyclic digital filter at the sampling frequency N.

1 Claim, 5 Drawing Sheets

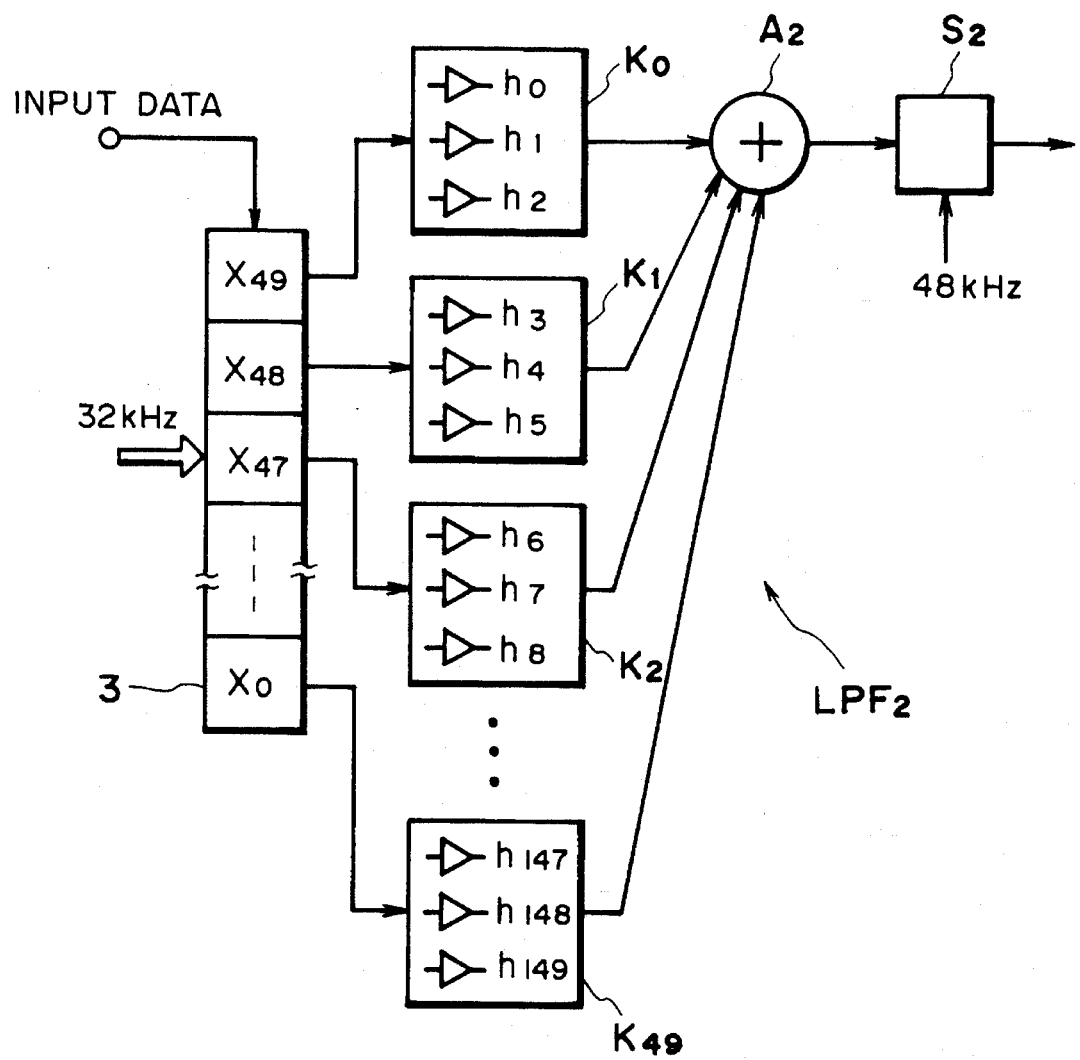
F I G. 1

SAMPLING FREQUENCY CONVERTER

This application is a Continuation of Ser. No. 08/024,202, filed Feb. 23, 1993, now abandoned.

BACKGROUND OF THE INVENTION

1. Field of the Invention

The present invention relates to a sampling frequency converter for converting input data sampled at a sampling frequency M into data sampled at a sampling frequency N.

2. Description of the Related Art

A conventional sampling frequency converter converts input data sampled at a sampling frequency M into data sampled at a sampling frequency N, by interpolating [(J/M)−1] zero data between the input data, supplying the interpolated data to a non-cyclic low-pass filter with i taps to over-sample it (J/M) times, and down-sampling the over-sampled data to obtain data every N-th, where J is the least common denominator.

A conventional technique of converting a sampling frequency will be described, wherein input data sampled at a sampling frequency 32 kHz is converted into data sampled at a sampled frequency 48 kHz, by using a non-cyclic digital low-pass filter having 150 taps.

Input data Xi (i=0, 1, 2, ...) shown in FIG. 5(a) sampled at a sampling frequency 32 kHz is supplied to a zero interpolating circuit So shown in FIG. 3. The zero interpolating circuit So is constructed of a selector for selecting either the input data or zero data in response to clocks of 32 kHz, and interpolates two zeros between each input data. The interpolated input data is sampled at a sampling frequency 96 kHz to obtain data shown in FIG. 5(b). The data shown in FIG. 5(b) and indicated by arrows corresponds to the data to be subjected to each operation of multiplications and additions.

A low-pass filter $LPF_1$ is constructed of a memory 2, multipliers $M_0, M_1, \ldots, M_{149}$, an adder $A_1$ for adding the outputs of the multipliers, and a sampler $S_1$ for sampling an output of the adder $A_1$ at a sampling frequency 96 kHz. The data from the zero interpolation circuit SO including 150 data elements ($X_{149}, \ldots, X_2, X_1, X_0$) inclusive of interpolated zero data is sequentially pushed and stored in the memory 2 in response to clocks of the sampling frequency 96 kHz. The stored data of 150 data elements is read in parallel in response to clocks of the sampling frequency 96 kHz. The multipliers multiply each data element by a corresponding one of coefficients $h_0, h_1, h_2, he_3, \ldots, h_{149}$. An output of the low-pass filter $LPF_1$ is supplied to a sampler $S_2$, and down-sampled at a sampling clock of 48 kHz which is one half of 96 kHz (the outputs from the low-pass filter are thinned every second). In this manner, the sampling frequency is converted according to the conventional technique. The larger the suffix i of the input data element Xi, the newer the data element in the time domain.

For the conventional sampling frequency conversion, the following operation of multiplications and additions is carried out by the multipliers $M_0$, $$
\begin{aligned}
d_0 &= h_0-0+h_1-0+h_2-X_{49}+ & \ldots & \quad h_{147}-0+h_{148}-0+h_{149}-X_0 \\
d_1 &= h_0-X_{50}+h_1-0+h_2-0+ & \ldots & \quad h_{147}-X_1+h_{148}-0+h_{149}-X_0 \\
d_2 &= h_0-0+h_1-X_{50}+h_2-0+ & \ldots & \quad h_{147}-0+h_{148}-X_1+h_{149}-X_0 \\
d_3 &= h_0-0+h_1-0+h_2-X_{50}+ & \ldots & \quad h_{147}-0+h_{148}-0+h_{149}-X_1 \\
d_4 &= h_0-X_{51}+h_1-0+h_2-0+ & \ldots & \quad h_{147}-X_2+h_{148}-0+h_{149}-0 \\
d_5 &= h_0-0+h_1-X_{51}+h_2-0+ & \ldots & \quad h_{147}-0+h_{148}-X_2+h_{149}-0 \\
d_6 &= h_0-0+h_1-0+h_2-X_{51}+ & \ldots & \quad h_{147}-0+h_{148}-0+h_{149}-X_2
\end{aligned}
\quad (1)
$$

The calculated data $d_0, d_1, d_2, d_3, \ldots$ are down-sampled to obtain the data, thinned every second, $d_0, d_2, d_4, \ldots$ which are outputted as final data $Y_0 (=d_0), Y_1 (=d_2), Y_2 (=d_4), Y_3 (=d_6), \ldots$.

The frequency spectra of the input data are shown in FIG. 4(a-1). The input data interpolated with zero, data and its frequency spectra are shown in FIG. 4(b) and 4(b1), with no difference between spectra of the original data and interpolated data. The output data from the sampler $S_1$ and its frequency spectra are shown in FIG. 4(c). The data down-sampled by the sampler $S_2$ and its frequency spectra are shown in FIGS. 4(d) and 4(d-1). The sampling frequency conversion from 32 kHz to 48 kHz is thus obtained as seen from the above frequency spectra.

With the above-described conventional method, the non-cyclic digital low-pass filter $LPF_1$ is required to perform an operation of multiplications and additions 150 times for each data train shown in FIG. 5(b) at the time interval of 1/(3*32 kHz)=10.4 μs, and the memory 2 is required to store 150 data elements. Therefore, the conventional method is associated with a problem of a large amount of hardware.

SUMMARY OF THE INVENTION

It is therefore an object of the present invention to provide a sampling frequency converter capable of performing an operation of multiplications and additions at a lower speed and realizing with a small amount of hardware.

According to one aspect of the present invention, there is provided a sampling frequency converter for converting input data sampled at a sampling frequency M into data sampled at sampling frequency N, which comprises: a non-cyclic digital filter including storage means for sequentially putting and storing E data elements in response to clocks of the sampling frequency M, and reading the stored E data elements in parallel and in response to each clock of the sampling frequency M, a plurality of coefficient multipliers for selecting E coefficients in response to each clock of the sampling frequency N, the E coefficients being extracted from (J*E/M) coefficients-every (J/M)-th where J is the least common denominator of M and N, and multiplying each data element read from the storage means by a corresponding one of the selected coefficients, and an adder for adding the multiplication results by the coefficient multipliers together; and a sampler for sampling an output of the non-cyclic digital filter at the sampling frequency N.

According to the sampling frequency converter of the present invention, input data is stored in the storage means in response to clocks of the sampling frequency M. E data elements stored in the storage means are read in parallel and in response to each clock of the sampling frequency M. Each of E coefficients selected in response to each clock of the sampling frequency N is multiplied by each data element read from the storage means by the corresponding coefficient multiplier. In this multiplication, E coefficients extracted from the (J*E/M) coefficients every (J/M)-th are multiplied by E data elements. The multiplication results are added and sampled in response to each clock of the sampling frequency N. In this manner, the sampling frequency conversion is performed. Coefficients are extracted every (J/M)-th and those coefficients to be multiplied by zero data as in the conventional are net extracted. Accordingly, the multiplications by zero data are omitted. The number of operations of the multiplications and additions per unit time reduces and the capacity of the memory reduces because zero data is not required to be stored.

DETAILED DESCRIPTION OF THE PREFERRED EMBODIMENTS

Figure 4A:
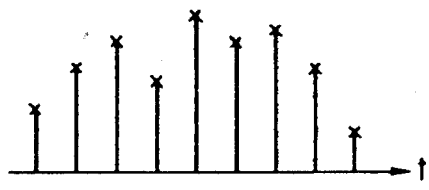
FIGS. 4A-, 4A-1, 4B, 4B-1, 4C, 4C-1, 4D, and 4D-1 are spectrum diagrams explaining the operation of the conventional sampling frequency converter shown in FIG. 3.
Figures 1, 4A:
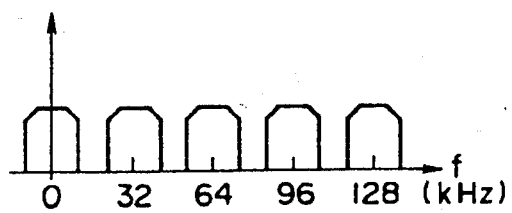
FIG. 1 is a block diagram showing the structure of a sampling frequency converter according to an embodiment of the present invention.
Figure 4B:
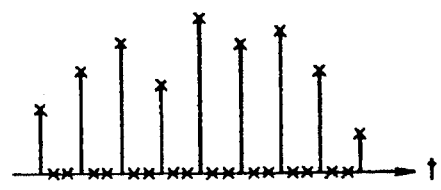
Figures 1, 4B:
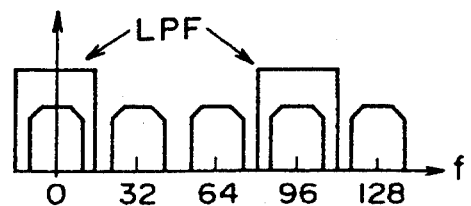
Figure 4C:
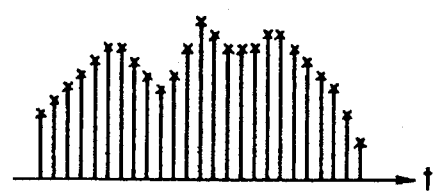
Figures 1, 4C:
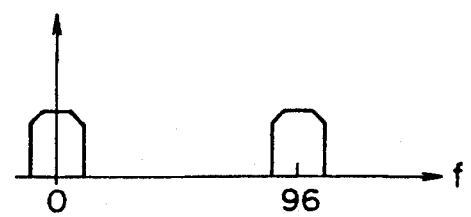
Figure 4D:
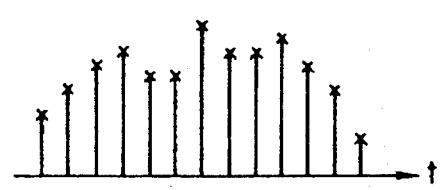
Figures 1, 4D:
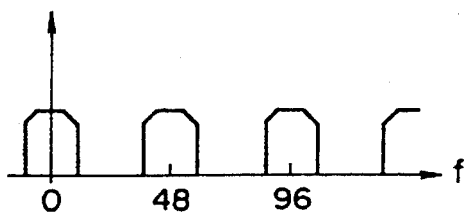
Figure 5A:
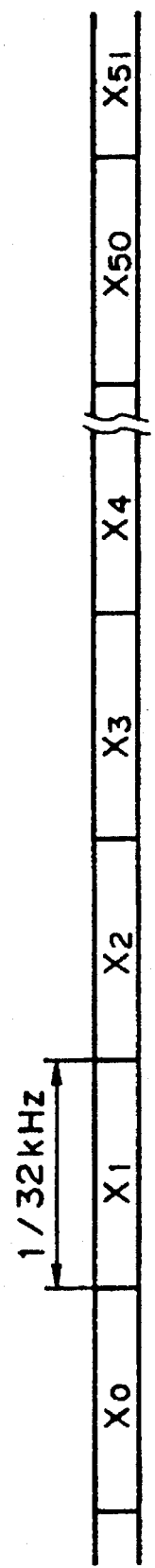
FIG. 5A and FIG. 5B explains the operation of the conventional sampling frequency converter shown in FIG. 3.
Figure 5B:
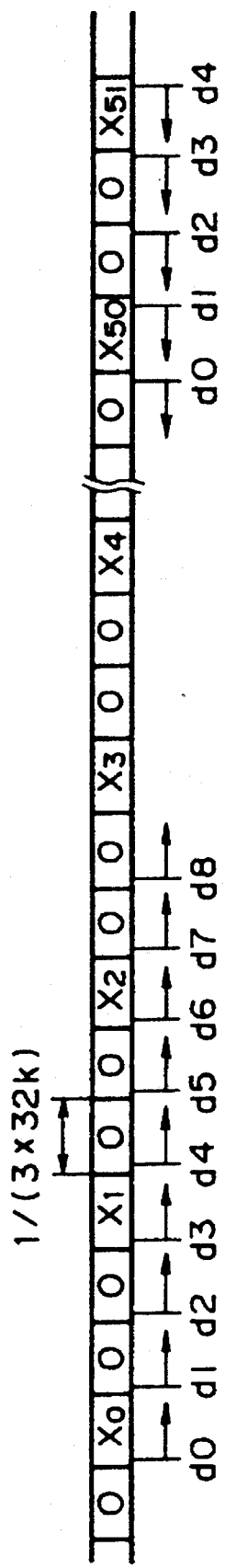

FIG. 1 is a block diagram showing an embodiment of a sampling frequency converter according to the present invention.

In the embodiment shown in FIG. 1, it is assumed that input data sampled at a sampling frequency 32 kHz is converted to data sampled at a sampled frequency 48 kHz.

Input data having 50 data elements $(X_{49}, \ldots, X_2, X_1, X_0)$ are supplied to a non-cyclic digital low-pass filter $LPF_2$. This low-pass filter is constructed of a memory 3, coefficient multipliers $K_0, K_1, \ldots, K_{49}$, an adder $A_2$ for adding the outputs of the multipliers, and a sampler $S_2$ for sampling an output of the adder $A_2$ at a sampling frequency 48 kHz. The input data is sequentially pushed and stored in the memory 3 in response to clocks of the sampling frequency 32 kHz. The stored data of 50 data elements is read in parallel and in response to each clock of the sampling frequency 32 kHz. The multiplier $K_0$ multiplies the newest data $(X_{49})$ in the time domain read from the memory 3 by one of coefficients $h_0, h_1$, and $h_2$ selected in response to a clock of the sampling frequency 48 kHz. The multiplier $K_1$ multiplies the next newest data $(X_{48})$ in the time domain read from the memory 3 by one of coefficients $h_3, h_4$, and $h_5$ selected in response to the clock of the sampling frequency 48 kHz and synchronously with the selection at the multiplier $K_0$. The multipliers $K_2$ to $K_{49}$ also operate in the similar manner as above. The multiplier $K_{49}$ multiplies the oldest data $(X_0)$ in the time domain read from the memory 3 by one of coefficients $h_{148}, h_{148}$, and $h_{149}$ selected in response to the clock of the sampling frequency 48 kHz and synchronously with the selection at the multiplier $K_0$.

Figure 2A:
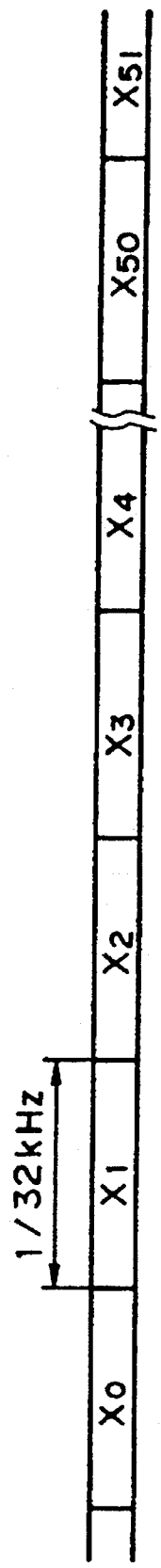
FIG. 2A and FIG. 2B explain the operation of the embodiment shown in FIG. 1.
Figure 2B:
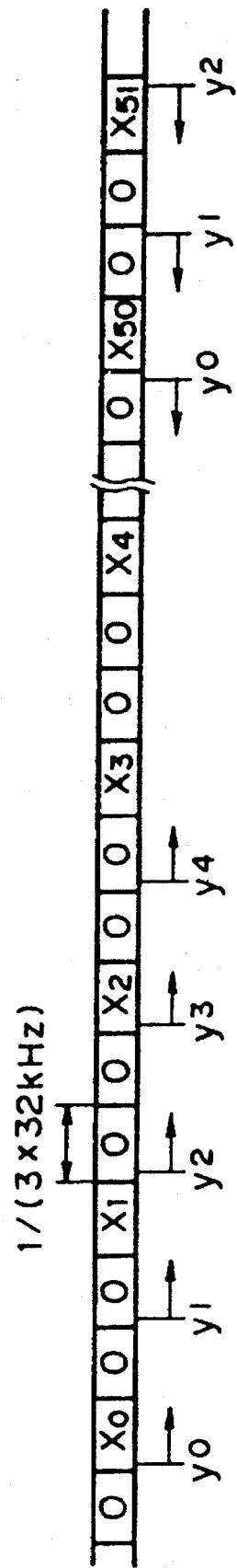
Figure 3:
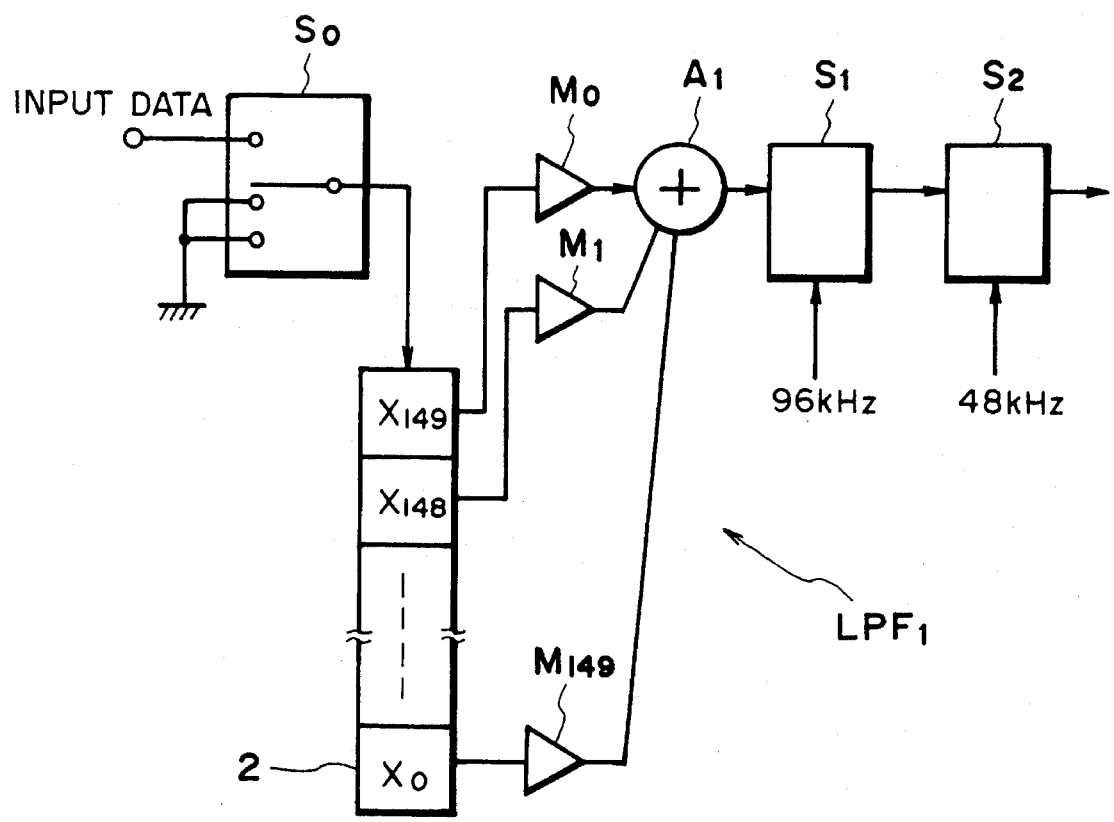
FIG. 3 is a block diagram showing the structure of a conventional sampling frequency converter.

The operation of the embodiment constructed as above will be described assuming that similar to the conventional example shown in FIG. 3, the data with two zero data being interpolated is supplied to the low-pass filter having 150 taps, and the data sampling frequency is 48 kHz. The original data such as shown in FIG. 2(a) is used. Therefore, the input data with two zero data being interpolated becomes as shown in FIG. 2(b). The data having 150 data elements inclusive of zero data shown in FIG. 2 (b) is read at the sampling frequency 48 kHz and supplied to the low-pass filter having 150 taps to perform the following operation of multiplications and additions.

$$\begin{aligned}
y_0 &= h_0 \cdot 0 + h_1 \cdot 0 + h_2 \cdot X_{49} + \ldots h_{147} \cdot 0 + h_{148} \cdot 0 + h_{149} \cdot X_0 \\
y_1 &= h_0 \cdot 0 + h_1 \cdot X_{50} + h_2 \cdot 0 + \ldots h_{147} \cdot 0 + h_{148} \cdot X_1 + h_{149} \cdot 0 \\
y_2 &= h_0 \cdot X_{51} + h_1 \cdot 0 + h_2 \cdot 0 + \ldots h_{147} \cdot X_2 + h_{148} \cdot 0 + h_{149} \cdot 0 \\
y_3 &= h_0 \cdot 0 + h_1 \cdot 0 + h_2 \cdot X_{51} + \ldots h_{147} \cdot 0 + h_{148} \cdot 0 + h_{149} \cdot X_2 \\
y_4 &= h_0 \cdot 0 + h_1 \cdot X_{52} + h_2 \cdot 0 + \ldots h_{147} \cdot 0 + h_{148} \cdot X_3 + h_{149} \cdot 0 \\
y_5 &= h_0 \cdot X_{53} + h_1 \cdot 0 + h_2 \cdot 0 + \ldots h_{147} \cdot X_4 + h_{148} \cdot 0 + h_{149} \cdot 0 \\
y_6 &= h_0 \cdot 0 + h_1 \cdot 0 + h_2 \cdot X_{53} + \ldots h_{147} \cdot 0 + h_{148} \cdot 0 + h_{149} \cdot X_4
\end{aligned} \qquad (2)$$

As understood from the equation (2), for the output data $Y_0, Y_3, Y_6, \ldots$, data multiplied by coefficients except $h_2, h_5, h_8, \ldots, h_{149}$ are all zero data. For the output data $y_1, Y_4, Y_7, \ldots$, data multiplied by coefficients except $h_1, h_4, h_7, \ldots, h_{148}$ are all zero data. For the output data $Y_2, Y_5, Y_8, \ldots$, data multiplied by coefficients except $h_0, h_3, h_6, \ldots, h_{147}$ are all zero Multiplications by zero data can be omitted without any difference in the calculation results.

In view of this, the coefficients $h_0, h_1, h_2, \ldots, h_{149}$ for the 150 taps are divided into row matrices $(h_0, h_3, h_6, \ldots, h_{147})$, $(h_1, h_4, h_7, \ldots, h_{148})$, and $(h_2, h_5, h_8, \ldots, h_{149})$ whose transposed matrices are represented by $[H_0]$, $[H_1]$, and $[H_2]$, respectively. The data matrices are represented by $[X_{49} \ X_{48} \ X_{47} \ldots X_0]$, $[X_{50} \ X_{49} \ X_{48} \ldots X_1]$, $[X_{51} \ X_{49} \ldots X_3]$, $[X_{51} \ X_{50} \ X_{49} \ldots X_3]$, $[X_{52} \ X_{51} \ X_{50} \ldots X_3]$, $[X_{53} \ X_{52} \ X_{51} \ldots X_4], \ldots$. Then, the outputs from the sampler $S_2$ are given by the following equation (3).

$$\begin{aligned}
\text{output } y_0 &= [X_{49}X_{48}X_{47}\ldots X_0] & [H_2] \\
\text{output } y_1 &= [X_{50}X_{49}X_{48}\ldots X_1] & [H_1] \\
\text{output } y_2 &= [X_{51}X_{50}X_{49}\ldots X_3] & [H_0] \\
\text{output } y_3 &= [X_{51}X_{50}X_{49}\ldots X_3] & [H_2] \\
\text{output } y_4 &= [X_{52}X_{51}X_{50}\ldots X_3] & [H_1] \\
\text{output } y_5 &= [X_{53}X_{52}X_{51}\ldots X_4] & [H_0] \\
\text{output } y_6 &= [X_{53}X_{52}X_{51}\ldots X_4] & [H_2] \\
&\vdots
\end{aligned} \quad (3)$$

In the sampling frequency converter shown in FIG. 1, 50 data elements read from the memory 3 are multiplied at the coefficient multipliers $K_0$ to $K_{49}$ by the coefficients selected in response to a clock of the sampling frequency 48 kHz. The multiplied results are added together by the adder $A_2$ which outputs the results $Y_0, Y_1, Y_2, \ldots$ of the matrix calculation given by the equation (3) synchronously with clocks of the sampling frequency 48 kHz. These outputs are picked up by the sampler $S_2$.

In this manner, data sampled at the sampling frequency 32 kHz is converted to the data sampled at the sampling frequency 48 kHz. Moreover, in this embodiment, the memory 3 is sufficient to have the capacity capable of storing 50 data elements and further the arithmetic operation of the multiplications and additions is only execute by fifty time during each period of the sampling rate 48 kHz. Moreover, in this embodiment, the memory 3 is sufficient to have the capacity capable of storing 50 data elements and further the arithmetic operation of the multiplications and additions is only executed by fifty times during each period of the sampling rate 48 kHz. As compared with the conventional sampling frequency converter, the capacity of the memory 3 becomes one third and the calculation speed becomes one sixth during each unit time period.

As described so far, according to the present invention, in the conversion from input data sampled at a sampling frequency M into data sampled at a sampling frequency N, the number of operations of the multiplications and additions reduces to $[(M*N)/(J^2)]$ per unit time and the capacity of the memory reduces by $(M/J)$, resulting in a small amount of hardware.

What is claimed is:

1. A sampling frequency converter for converting input data sampled at a sampling frequency M into dam sampled at sampling frequency N, comprising:

a storage means for sequentially inputting and storing E data elements in response to clocks of said sampling frequency M, and reading said stored E data elements in parallel and in response to each clock of said sampling frequency M, a coefficient providing means for circularly selecting a set of E coefficients in response to each clock of said sampling frequency N and to provide said selected set of E coefficients, said set of E coefficients including at least one coefficient associated with each of a plurality of coefficient multiplier for multiplying each of E data elements read from said storage means by a corresponding one of said E coefficients, an adder for adding together said multiplication results by said coefficient multipliers, and a sampler for sampling an output of said adder at said sampling frequency N, wherein said selected set of E coefficients comprises E coefficients extracted every (J/M)-th from a series of (J*E/M) coefficients of a predetermined non-cyclic digital filter, where J is the least common denominator of M and N.

* * * * *